United States Patent
Fujikawa et al.

(10) Patent No.: US 6,323,120 B1
(45) Date of Patent: Nov. 27, 2001

(54) METHOD OF FORMING A WIRING FILM

(75) Inventors: Takao Fujikawa; Yutaka Narukawa, both of Takasago; Kohei Suzuki; Takuya Masui, both of Kobe, all of (JP)

(73) Assignee: Kabushiki Kaisha Kobe Seiko, Kobe (JP)

( * ) Notice: Subject to any disclaimer, the term of this patent is extended or adjusted under 35 U.S.C. 154(b) by 0 days.

(21) Appl. No.: 09/522,473

(22) Filed: Mar. 9, 2000

(30) Foreign Application Priority Data

Mar. 18, 1999 (JP) .................................................. 11-073934

(51) Int. Cl.$^7$ .................................................. H01L 21/283
(52) U.S. Cl. .......................... 438/629; 438/660; 438/661; 438/678; 438/687; 438/637
(58) Field of Search ..................................... 438/629, 637, 438/640, 660, 661, 678, 687, FOR 355

(56) References Cited

U.S. PATENT DOCUMENTS

| | | |
|---|---|---|
| 5,006,213 | 4/1991 | Sichmann et al. . |
| 5,527,561 | 6/1996 | Dobson . |
| 6,022,800 | * 2/2000 | Ho et al. . |
| 6,043,148 | * 3/2000 | Peng et al. . |
| 6,077,780 | * 6/2000 | Dubin . |
| 6,146,517 | * 11/2000 | Hoinkis . |
| 6,184,137 | * 2/2001 | Ding et al. . |
| 6,211,071 | * 4/2001 | Lukank et al. . |
| 6,221,763 | * 4/2001 | Gilton et al. . |

FOREIGN PATENT DOCUMENTS

| | | |
|---|---|---|
| 2-161285 | 6/1990 | (JP) . |
| 4-136820 | 5/1992 | (JP) . |
| 08264535 | 10/1996 | (JP) . |
| 2-205678 | 10/1997 | (JP) . |
| 10092820 | 4/1998 | (JP) . |
| 10-294315 | 11/1998 | (JP) . |
| 11067766 | 3/1999 | (JP) . |
| 11191556 | 7/1999 | (JP) . |

* cited by examiner

*Primary Examiner*—George Fourson
*Assistant Examiner*—Joannie Adelle Garcia
(74) *Attorney, Agent, or Firm*—Oblon, Spivak, McClelland, Maier & Neustadt, P.C.

(57) ABSTRACT

A method of forming an intact wiring film by applying a filling treatment with a metal material with no pores to holes/trenches, the method comprising forming a barrier layer 3 to an insulation film 2 having holes/trenches 2A, forming a seed layer by a PVD method on the surface of the barrier layer and laminating a wiring film 5A by a electrolytic plating method and heat treating the same under a high temperature/high pressure gas atmosphere.

3 Claims, 2 Drawing Sheets

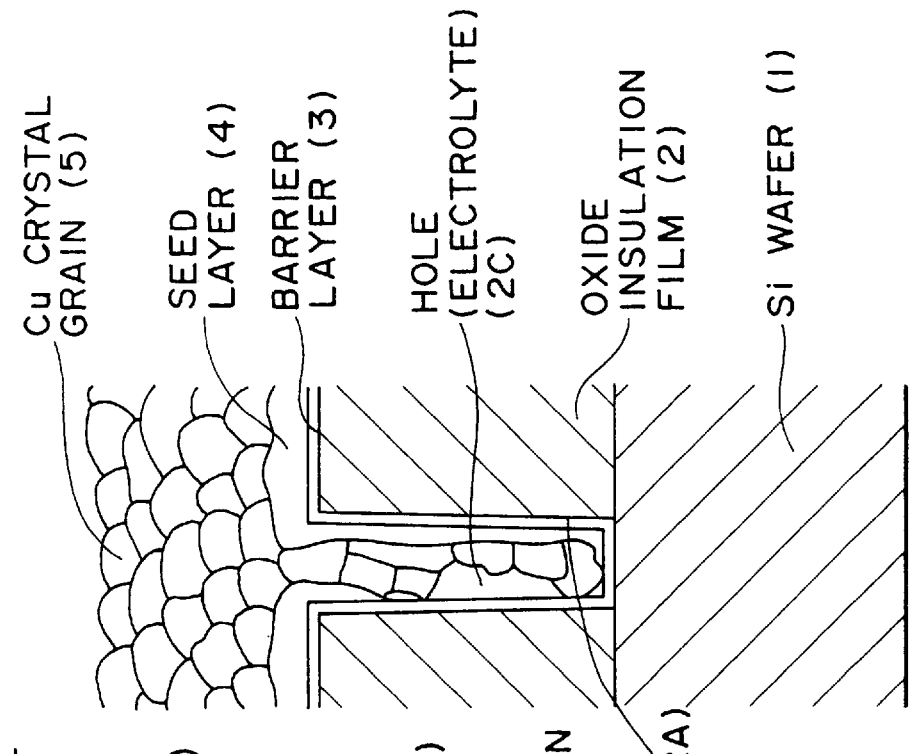
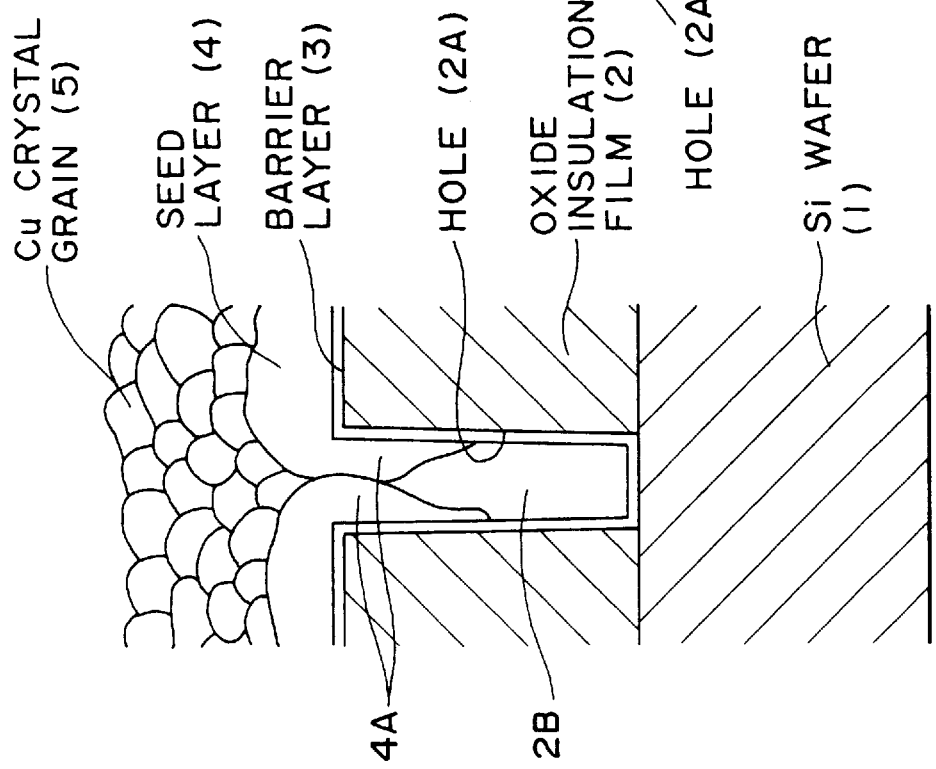

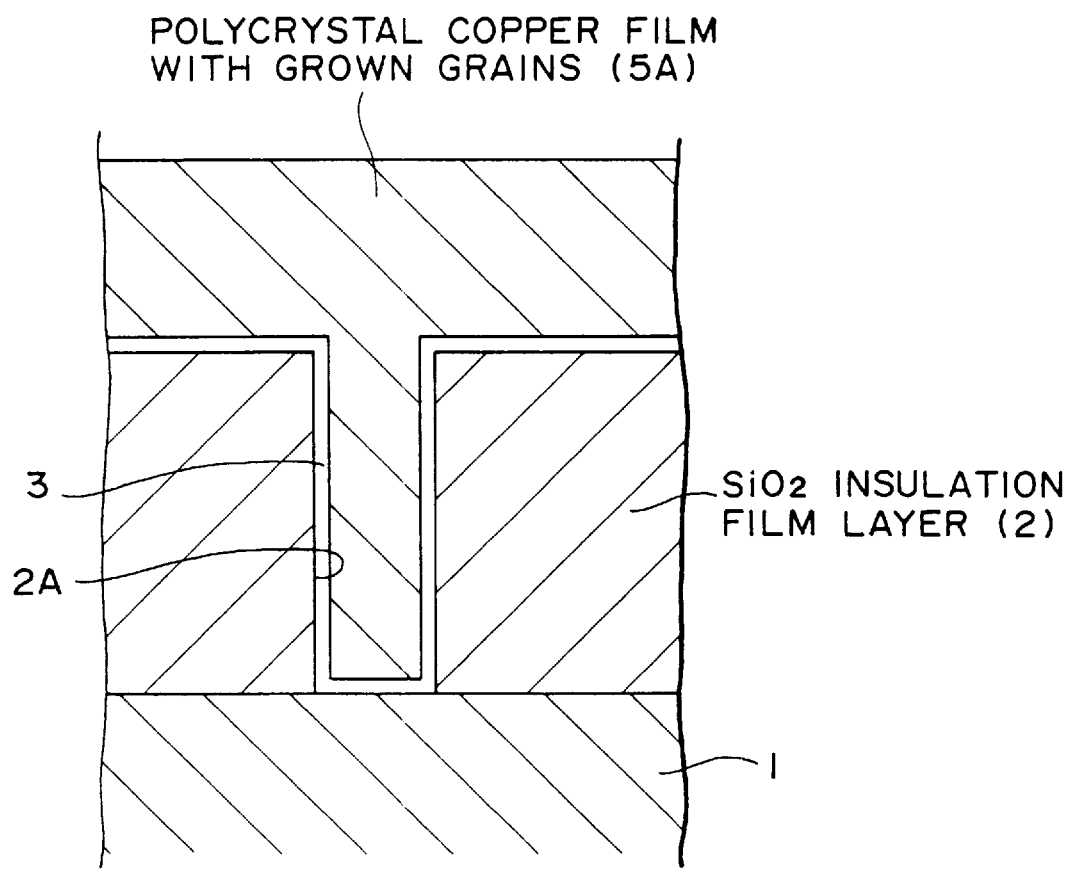

METHOD OF FORMING A WIRING FILM

BACKGROUND OF THE INVENTION

1. Field of the Invention

The present invention concerns formation of a wiring film in a production process of semiconductors typically represented by ULSI and, more in particular, it relates to a method of forming a film of a wiring material of copper or copper alloy by a electrolytic plating method and, further, heat treating the film in a high pressure/high temperature gas atmosphere thereby filling the holes in a connection portion or wiring trenches with a material for the wiring film and obtaining good adhesion.

2. Related Art Statement

Japanese Patent No. 2660040 (registered on Jun. 6, 1997) discloses "a vacuum film forming method comprising a step of forming a thin metal film on a substrate having concave portions by a vacuum thin film forming method such as a sputtering method, CVD process or vacuum vapor deposition process, a step of heating and fluidizing the entire thin metal film formed on the substrate and a step of pressurizing the metal of the fluidized thin metal film with a gas and filling the metal of the thin metal film into the concave portions so as not to form voids in the concave portion".

Further, Japanese Patent Publication No. Hei 7-193063 discloses a method of treating an article having a surface and having at least one concave portion within the surface, the method includes forming a layer on at least a portion of the surface, the layer extending over the concave portion and, further, exposing the article and the layer to high pressure and high temperature enough to deform a portion of the layer so as to fill the concave portion".

This prior publication describes that the article is a semiconductor wafer and the concave portion comprises, for example, holes, trenches and viaholes formed to the semiconductor wafer and the layer is made of a metal such as aluminum.

Further, it also discloses that, in a case where the layer is made of aluminum, the temperature is from 350 to 650° C. and the pressure is at 3,000 psi or higher, a gas can also be used for pressurization and it is necessary that the layer formed over the hole or the groove has a thickness at least equal with the width of the hole.

Further, it describes that even when a semiconductor wafer itself includes a plurality of layers of different characteristics, it can be produced as a result of a production process including a plurality of steps for forming them.

As described above, the known prior arts disclose that squeezing or introducing the material by high pressure at a high temperature is effective as a method of filling voids formed in the holes or trenches for improvement of the electro-conductivity of the wiring film (mainly) of semiconductors.

However, the Al wiring films shown by the prior literatures have come to their limit in view of the electron migration (EM) resistance or lowering of electric resistance required along with finer/higher integration of ULSI in the feature. While Cu has been expected recently as being excellent over Al with respect to the situations described above, since the conditions for film formation and the film structure after film formation of Cu greatly differ from those of Al and no comparable effect can be obtained if the prior art described above is applied as it is.

Particularly, with respect to the copper wiring film, since it is difficult for line fabrication by etching after forming the wiring film by the PVD method as in the Al wiring film, a method of previously forming trenches in the insulation film, in which the material for the copper wiring film is filled and then scraping off by grinding to form wirings has been adopted. Further, in this case, an electrolytic plating method is considered advantageous in view of the cost and the productivity and many semiconductor manufacturers have earnestly intended for the establishment of the technique. Further, the electrolytic plating method has advantages that the electrolytic plating is a low temperature process carried out near the room temperature and enables combination with an organic series material having a heat resistance at 350 to 380° C. and considered as a promising candidate with regard to the subject of lowering the dielectric constant of the insulation film material, which is considered important along with temperature lowering of the wiring film material.

The present inventors have made a study based on experiments or the like by applying such prior art to copper series wiring films, particularly, copper wiring films formed by electrolytic plating method, found several problems and have reached the present invention.

OBJECT OF THE INVENTION

A first subject of the present invention resides in that a copper wiring formed by an electrolytic plating method has a small crystal grain size and causes crystal grain growth, when left, even at a room temperature to lower the electric resistance therealong, but lacks in stability. For stabilization, it is necessary for annealing at a temperature of 300 to 380° C.

A second subject resides in that nano-scale pores between the crystal grains are coagulated to form large voids upon annealing, to often result in disconnected portions in the aimed wiring structure.

Further, a third subject resides in that while no problems occur if holes such as contact holes or trenches are filled only with copper over the entire area of a semiconductor substrate, an electrolyte solution often remains in the holes and the water ingredient in the electrolyte solution boils during annealing to break the copper wiring film and that the broken powder forms powdery dusts of particles.

Further, when the present inventors have applied a method similar to that shown in the prior art of conducting processing under high temperature/high pressure gas atmosphere to a Si substrate formed with a Cu wiring film formed by the electrolytic plating method, it has been found that while large voids are eliminated at a relatively low temperature of 350° C. and at a pressure of about 120 MPa, spherical pores and the like due to the plating solution remained in the holes tend to be left as they are. It has also been found that for suppressing the formation of the spherical pores and the like, it is inevitable to elevate the temperature upon processing under a high temperature/high pressure gas atmosphere to 450° C. or higher, or make the retention time longer such as 2 hours or more.

On the other hand, when the present inventors have applied processing to the Cu wiring film formed only by the PVD method under a high temperature/high pressure gas atmosphere, and found that a pressure of 200 MPa or higher at a temperature of 450° C. or higher is required for filling the contact holes or viaholes in a poreless state although depends on the size of the hole and the thickness of the thin film.

Further, the present inventors have made a study on the reference that the temperature and the pressure as the conditions for the high temperature/high pressure processing greatly differ between the plated-Cu film and PVD-Cu film, and found that hydrogen intruding inevitably in the course of electrolytic plating probably promotes the diffusing phenomenon of Cu element at low temperature in case of electrolytically plated-Cu.

Taking notice of the difference of the copper wiring film formed by the electrolytic plating method and the copper wiring film formed by the PVD method, the present inventors have made experiment and study with a purpose of ensuring the quality and improving the reliability and the yield, namely, for overcoming the foregoing subject on the method of processing the copper wiring film formed by combination of the PVD method, the electrolytic plating method and the heat treatment under high pressure gas atmosphere and, as a result, have accomplished the present invention.

SUMMARY OF THE INVENTION

The present invention provides a method of forming a wiring film by covering the surface of an insulation film of a substrate having the insulation film formed with holes/trenches with a metal material of copper or copper alloy thereby enforcing and filling the metal material to the inside of the holes/trenches to form the wiring film and adopts the following technical means for attaining the foregoing subject.

That is, the present invention has a feature in forming a barrier layer on the surface of an insulation film including the holes/trenches, then forming a seed layer of the metal material described above so as to bridge and close opening portions of the holes/trenches by a PVD method, depositing a metal material of copper or copper alloy comprising crystal grains by an electrolytic plating method on the surface of the seed layer thereby forming a wiring layer and, subsequently, applying a heat treatment under a high temperature/high pressure gas atmosphere thereby enforcing and filling the metal material into the inside of the holes/trenches.

In a preferred embodiment according to the present invention, the seed layer by the PVD method is conducted near a room temperature by setting the distance between a target and a substrate to 20 to 100 mm.

Furthermore, in another embodiment according to the present invention, the metal material for the wiring film comprises fine crystal grains with an average grain size of 0.1 µm or less.

As described above, by reducing the average crystal grains to a fine crystal grain size of 0.1 µm or less, the super plastic phenomenon is developed remarkably thereby enabling to attain poreless structure at low pressure/low temperature.

DESCRIPTION OF THE ACCOMPANYING DRAWINGS

FIG. 1a and FIG. 1b are schematic views showing two examples of a typical structure obtained by forming films by an electrolytic plating method; and FIG. 2 shows a wiring film obtained by heat treatment of the structure shown in FIG. 1a and FIG. 1b.

PREFERRED EMBODIMENTS OF THE INVENTION

Preferred embodiments of the present invention and effects thereof are to be explained with reference to the drawings.

FIG. 1 shows examples of a typical structure in a case of forming films by an electrolytic plating method. In FIG. 1a and FIG. 1b, a semiconductor substrate 1 exemplified as an Si wafer has an oxide insulation film (insulation layer) 2 formed with a hole/groove 2A.

In this invention, a barrier layer 3 is formed to the surface of the insulation film 2 including a hole/trench 2A for preventing copper from diffusing to the insulation film 2 or Si in the substrate 1 by a CVD process or a PVD method such as sputtering. As a material for the barrier layer 3, nitride series materials such as TiN, TaN and WN are highly recommended since they have great diffusion preventive effect. For applying electrolytic plating, it is necessary to coat the surface of the barrier layer 3 with a metal of high electro-conductivity to form a layer referred to as a seed layer 4, and a metal material made of copper or copper alloy identical with the wiring film 5 is usually used. The seed layer may be formed also by the CVD process and the PVD method, and the PVD method Gong-throw sputtering method for forming the seed layer 4 usually also at the inside of the hole 2A) is used with a view point of adhesion, contamination and cost. On the surface of the seed layer 4, a wiring film 5 comprising crystal grains of a metal material such as copper or copper alloy, preferably, fine crystal grains with an average crystal grain salts of 0.1 µm or less are deposited and formed by an electrolytic plating method.

By the way, in the long throw sputtering method employed for the formation of the seed layer, copper as the material is supplied from a disc-shaped target disposed opposing to the substrate 1. During sputtering, a copper film tends to be deposited at a greater thickness in a central portion of the circular substrate and, if it is applied to a somewhat greater thickness, the seed layer 4 causes bridging over the opening of the hole 2A to close the opening of the hole 2A, that is, causes overhung to leave a cavity 2B at the inside as shown in FIG. 1a. The cavity 2B is often referred to as a center void. In this case, if the seed layer 4 causes excessive overhung, a plating solution no more intrudes into the hole 2A. In a case where only the usual plating is applied, such a state does not apparently function as the wiring film 5 (crystal grains).

Further, if the seed layer is formed to a somewhat reduced thickness for avoiding this, the seed layer 4 is not deposited sufficiently to the wall surface on the side near the center of the hole 2A and the portion lacking in the seed layer 4 after the electrolytic plating forms a void 2C near the outer circumference of the disc-shaped substrate, and electrolyte remains in the void as shown in FIG. 1b. Since such void 2C is found the near the edge of the substrate 1, it is often referred to as an edge void.

When a heat treatment is applied in a highly pressurized gas atmosphere to the wiring film 5 in the state shown in FIG. 1a, the metal material clogging the portion over the hole 2A is enforced by the pressure as shown in FIG. 2 by which the void 2B is eliminated to attain an intact state and, at the same time, growing of crystal grains is promoted and a wiring film 5A having a larger crystal grain size compared with that of the wiring film generally heat treated at an atmospheric pressure can be obtained, and a film which is preferred also in view of the lowered electric resistance can be obtained.

In a state as shown in FIG. 1b, when annealing is applied under an atmospheric pressure, the plating solution, particularly, the water ingredient in the void 2C boils to break the wiring film (crystal grains) 5 covering the void. As described above, the broken copper wiring material contaminates as so-called particles the substrate 1. Although it is possible to eliminate such void 2C by a heat treatment in a high temperature/high pressure gas atmosphere, this leads to a problem that the temperature upon high temperature/high pressure processing has to be elevated or the process keeping time has to be extended such as for several hours in order to discharge the remaining plating solution out of the system as described previously.

In the present invention, the state as shown in FIG. 1a is positively formed, that is, the barrier layer 3 is formed and the seed layer 4 is formed thereon so as to bridge and close the opening portion for the hole/trench 2A by a PVD method and utilizes that the seed layer can be in a hydrogen enriched state when the film is formed by the electrolytic plating method in the next step. That is, the wiring film formed only by the PVD method, can not be filled into the hole 2A unless using high temperature and high pressure of 450° C. or higher and 200 MPa or higher. However, when the seed layer 4 is formed below (previously) by the PVD method shown in FIG. 1a and, further, the copper layer (wiring film) 5 is piled by the electrolytic plating method, since the effect of intruding hydrogen into the seed layer 4 formed by the PVD method is obtained, diffusion and deformation of the seed layer 4 formed by the PVD method are facilitated, so that the drawback of the PVD method can be compensated and, as a result, complete filling can be attained by the treatment at low temperature and pressure and under high temperature/high pressure gas atmosphere for a short period of time such as several minutes. A sufficient thickness of the seed layer 4 formed by the PVD method is such one as can bridge and close the opening of the hole 2A as described previously. That is, in a case of using a PVD (sputtering) apparatus in which the distance between the target and the Si substrate 1 is about 20 to 100 mm, it is enough that the thickness of the seed layer is equal with or more than the diameter of the hole 2A. Further, sputtering near the room temperature is recommended since this can form a fine copper layer in a short period of time.

The thickness of forming the crystal grain layer (wiring layer) made of a metal material of copper or copper alloy by electrolytic plating, together with that of the seed layer 4 formed below (previously) by PVD is appropriately 2 to 5 times the diameter of the hole 2A. If it is excessively thick, the amount of the copper layer removed by CMP process (Chemical Mechanical Polishing) after the processing under the high temperature/high pressure gas atmosphere is increased which is not economical.

Further, in the application of the present invention, since the material and the method of forming the barrier layer 3, the method of forming the seed layer 4 in a case of the electrolytic plating method and the like have a great concern, it is important also taking them into consideration. Particularly, it is important that the barrier layer 3 is intact and, if there is a portion not deposited to the wall surface of the hole 2A as in the seed layer 4 shown in FIG. 1b, no intact wiring structure can be obtained even if the present invention is applied. Although materials not reactive with copper and having favorable affinity is ideal, satisfactory materials can scarcely be found at present. TiN, TaN and WN are recommended materials among them. For the method, it is preferred to use the CVD process capable of forming a film at a uniform thickness even in a thin and narrow hole.

Another advantage obtained in the present invention is that the seed layer 4 formed by the PVD method is easily put to Cu film with (111) orientation on the Si substrate 1. It has been known that (111) orientation described above is preferred with a view point of lowering electric resistance and in view of electro-migration resistance. Then, a combination of the PVD method and the electrolytic plating method for the formation of the wiring film 5 thereon in the present invention can be said ideal in view of the improvement of characteristics to electro-migration, which gives a significant effect on the reliability.

Further, it is expected that finer and higher integration will be progressed in the feature and, particularly, the diameter of the contact hole or the viahole explained above will be decreased to 0.15 μm–0.1 μm. It is considered difficult to fill copper in a narrow and deep hole even by using the long throw sputtering process with improved directionality by increasing the distance between the target and the Si substrate 1 as 200 mm or more and, further, the film can not be formed unless the copper seed layer is deposited by the PVD method or the CVD process also in a case of the electrolytic plating method and a method of conducting plating after depositing the copper seed layer by the CVD process capable of filling even a fine hole has been under study but the copper film formed by the CVD process lacks in adhesion and involves various technical problems.

The present invention has a feature in that the hole 2A formed in the barrier layer 3 is bridged at 4A with the seed layer 4 by the PVD method (sputtering method) and the feature of the PVD method that bridging can be applied more easily as the diameter of the hole 2A is smaller can be utilized counter movingly. That is, the present invention has a feature that it is extremely advantageous for smaller sizes of the hole 2A in the feature.

Furthermore, it has been found that the processing under the high pressure gas atmosphere according to the present invention can improve the adhesion between the wiring film 5 itself and substrate 1 due to the compressive effect by the high pressure, namely, adhesion of the barrier layer 3 or the insulation film 2, to obtain highly preferred results also for the improvement of the reliability.

The followings are typical examples for the conditions and the atmosphere of the heat treatment under the high pressure gas atmosphere in the foregoing explanations.

As the gases to be employed, use of an inert gas such as Ar is recommended. Basically, there is no particular restriction so long as the gas can form an atmosphere not oxidizing or denaturing the Si substrate 1 or the material of the wiring film 5. Further, referring to the pressure, higher pressure has higher effect only in view of the filling function or the effect of promoting the surface diffusion. However, since the scale of the apparatus is increased, that is, the cost becomes expensive as the pressure is higher as described above and the amount of gas used is also increased, and it is not favorable with an economical point of view. The effect referred to in the present invention can be developed at a pressure of 30 MPa or higher. With a viewpoint of the cost for the apparatus, it is recommended that the pressure is 200 MPa or less, or preferably, 120 MPa or lower. The temperature for the heat treatment also depends on the pressure and the effect can be obtained even at a lower temperature as the pressure is increased and, a temperature from 350 to 470° C. is recommended for the pressure within the range described above.

EXAMPLE

The present invention will be explained more in details while referring to examples.

TABLE 1

| | Size of hole/trench | | | | Film forming condition | | | | Annealing condition | | | Result of processing | Volumeric specific resistance ($\mu\Omega cm$) | Remarks |
|---|---|---|---|---|---|---|---|---|---|---|---|---|---|---|
| | Hole diameter ($\mu m$) | Trench width ($\mu m$) | Total depth ($\mu m$) | A.R. | Barrier layer | Seed layer | Copper film thickness ($\mu m$) | Pressure (MPa) | Temperature (° C.) | Time (min) | | | | |
| Example 1 | 0.25 | none | 1 | 4 | TiN (CVD) | PVD 300 nm | 0.9 | 100 | 380 | 5 | ⊚ | ~1.8 | |
| Example 2 | 0.25 | 0.4 | 1 | 4 | TiN (CVD) | PVD 400 nm | 0.9 | 100 | 380 | 5 | ⊚ | ~1.8 | |
| Example 3 | 0.15 | none | 1 | 6.7 | TiN (CVD) | PVD 200 nm | 0.7 | 120 | 350 | 5 | ⊚ | ~1.8 | |
| Example 4 | 0.4 | none | 2.4 | 6 | TaN (PVD) | PVD 500 nm | 1.3 | 120 | 350 | 5 | ⊚ | 1.82 | |
| Comparative Example 1 | 0.25 | 0.4 | 1 | 4 | TiN (CVD) | PVD 300 nm | 0.9 | atmospheric pressure | 380 | 5 | x | | State after electrolytic plating, same as in Example 1. Voids left as it was after annealing |
| Comparative Example 2 | 0.25 | 09.4 | 1 | 4 | TiN (CVD) | PVD 400 nm | 0.9 | atmospheric pressure | 380 | 5 | x | | Filling of copper wiring film into trench insufficient in edge portion. Void formed in the midway. |
| Comparative Example 3-A | 0.15 | none | 1 | 6.7 | TiN (CVD) | PVD (LTS) 400 nm | 0.7 | 120 | 350 | 5 | Δ | | Central part could be buried but obstacles deposited at the bottom of hole in peripheral portion although the portion could be filled. |
| Comparative Example 3-B | 0.15 | none | 1 | 6.7 | TiN (CVD) | only PVD 300 nm | 0.7 | 120 | 350 | 5 | x | | Holes could not be filled at all. |
| Comparative Example 4 | 0.4 | none | 2.4 | 6 | TaN (PVD) | PVD (LTS) 350 nm | 1.3 | 120 | 350 | 5 | Δ | | Central portion of Si substrate could be filled but through holes were left in the peripheral portion. |

Table 1 shows the result of conducting an experiment for manufacturing a wiring film by applying pressure-filling treatment utilizing a high pressure gas after forming a wiring film on contact holes or on wiring trenches by a damascene method formed on Si wafer of 200 mm diameter using Cu as the material for the wiring film. In the table, A.R. (Aspect Ratio) shows a ratio of the depth/the diameter of the contact hole. Referring to the symbols indicated in the column for the result of filling, "⊚" shows that the contact hole is completely filled by the material of the wiring film without leaving voids, "X" indicates that the voids are left and "Δ" indicates that some contact holes are not filled at all or certain contact holes can not be filled completely to leave voids in the inside and they are not in a state usable for the production in view of the reliability.

Argon was used as a gas for press-filling treatment and an HIP apparatus at a highest pressure of 200 MPa and at a highest processing temperature of 1000° C. were employed.

In Example 1 and Comparative Example 1, a TiN barrier layer was deposited at an order of 5 to 10 nm by a CVD process to Si wafers formed with contact holes each of 0.25 $\mu$m diameter and A. R.=4, then a copper seed film layer was deposited to 300 nm by a sputtering method with a distance between the target and the Si substrate of about 40 mm and then a pure copper wiring film was formed to a thickness of about 1 $\mu$m by an electric plating method and heat treatment was applied under a high temperature/high pressure gas atmosphere and under an atmospheric pressure.

In each of the cases, the structure of the copper wiring film after electrolytic plating comprised many fine grains of 0.1 $\mu$m or less, especially 20 to 30 nm or less. Since the copper seed layer was applied to a somewhat large thickness as 300 nm, the copper seed layer overhung at the opening in each of the holes over the entire surface of the substrate. The pressure upon heat treatment was 100 MPa of with argon in Example 1 and an atmospheric pressure (0.1 MPa) in Comparative Example 1-A. Based on comparison between both of them, while complete filling was attained in Example 1 according to the present invention, holes were left substantially as they were with no filling at all in Comparative Example 1 treated under an atmospheric pressure.

Example 2 and Comparative Example 2 were applied to a so-called damascene structure in which holes of 0.25 $\mu$m and about 0.6$\mu$m depth were formed to trenches of 0.45 $\mu$m with and 0.4 $\mu$m depth (A. R.=1). A copper seed film of 300 nm thickness was formed on the barrier layer by using a PVD apparatus with the distance between the target and the Si substrate being somewhat longer as 100 mm. Then, a copper film was electrolytically plated to a thickness of 600 nm. It was confirmed that the holes at the periphery Si substrate were also in a closed state at the openings by bridging. Further, concave portions were observed for the trench portion. In Example 2 in which the sample was heat treated under a high pressure gas atmosphere, holes were completely filled with copper in the peripheral portion as well as in the central portion of the Si substrate, and the inside of trenches at the peripheral portion was also completely filled with copper by a so-called high pressure reflow phenomenon and the flatness on the surface was also excellent. On the other hand, in Comparative Example 2 which was heat treated under an atmospheric pressure, portions with voids formed at the closed insides were present here and there near the surface for the incompletely filled trench portion and more unevenness was present on the surface of the trench compared with Example 2.

Example 3, Comparative Example 3-A and Comparative Example 3-B were applied to holes of a large aspect ratio (6.7) in which the hole diameter was as fine as 0.15 $\mu$m and the depth was 1 $\mu$m. A TiN barrier layer was formed to all of the samples by the CVD process under the same conditions. Subsequently, the copper seed layer was applied to 200 nm by using a sputtering apparatus with a distance between a sputtering target and an Si substrate of about 40 mm. Complete bridging was formed in this state. Further, in Comparative Example 3-A, a copper seed layer was applied to 30 nm by long throw sputtering. Further, in Comparative Example 3-B, the layer was applied to the total thickness of 700 nm by a long throw sputtering method. Then, in Example 3 and Comparative Example 3-A, copper layers of 500 nm and 700 nm were applied by an electrolytic plating method. Both of Comparative Example 3-A in which the copper seed layer was applied by using the long throw sputtering method and Comparative Example 3-B applying the layer for the entire thickness by the same method, copper was not deposited on the side wall at the bottom of the hole and, particularly, voids were left on the bottom as well as the side wall of the hole, particularly, in the edge portion of the substrate.

In Example 3, it was confirmed that intact filing was possible even in such deep holes. In Comparative Example 3-A, while filling was conducted, deposition of obstacles considered to the attributable to the additive ingredient of the plating solution was observed at the bottom of the holes. Further, in Comparative Example 3-B, filling was not obtained at all although the treatment was applied under the same high temperature/high pressure treatment condition as those in Example 3. From the result, it has been judged that filling could be conducted even at a temperature of 350° C. by the intrusion of hydrogen along with electrolytic plating treatment also to the PVD copper seed layer.

Example 4 and Comparative Example 4 were applied to contact holes having relatively large diameter and large depth. In Example 4 in which the thickness of the copper seed layer deposited by the PVD method on the barrier layer was 1.25 times the diameter of the hole, complete filling could be obtained over the entire surface of the Si substrate according to the present invention. However, in Comparative Example 4 in which the thickness of the copper seed layer is somewhat smaller than the diameter of the hole 3 (about 0.9 times), although filling could be done in a central portion, fine voids were found to be left here and there at the peripheral portion which is considered to be attributable to the electrolytic plating solution.

As has been described above, the present invention enables lowering of electrical resistance with the wiring film providing an important subject in the production of ULSI semiconductor in which finer and multi-layered structure will be progressed more and more in the feature and, particularly, enables to prevent peeling-off of the wiring film caused by the electrolytic solution in the electrolytic plating method which is considered as a predominant industrial method of forming copper wiring films with a view point of production cost and combination with the low dielectric film, and a remarkable effect can be expected in view of the improvement of reliability and the improvement of yield. In particular, for the higher level of integration in ULSI which is expected to proceed rapidly in the feature, the present, which invention suitable to filling of fine holes with a material for metal wiring film contributes much in view of the industrial production.

What is claimed is:

1. A method of forming a wiring film by covering the surface of an insulation film formed with holes/trenches of a substrate with metal material selected from the group consisting of copper and copper alloy, thereby forcing and filling the metal material to the inside of the holes/trenches, wherein the method comprises, forming a barrier layer on the surface of the insulation film including the holes/trenches, then forming a seed layer of the metal material described above so as to bridge and close opening portions of the holes/trenches by a PVD method, depositing a metal material of copper or copper alloy comprising crystal grains by an electrolytic plating method on the surface of the seed layer, thereby forming a wiring layer and, subsequently, applying a heat treatment under a temperature/pressure gas atmosphere, thereby forcing and filing the metal material into the inside of the holes/trenches.

2. A method of forming a wiring film as defined in claim 1, wherein the formation of the seed layer by the PVD method is conducted at or near the room temperature and setting the distance between the target and the substrate to 20–100 mm.

3. A method of forming a wiring film as defined in claim 1, wherein the metal material of the wiring film comprises fine crystal grains with an average crystal grain size of 0.1 $\mu$m or less.

* * * * *

UNITED STATES PATENT AND TRADEMARK OFFICE
CERTIFICATE OF CORRECTION

PATENT NO. : 6,323,120 B1
DATED : November 27, 2001
INVENTOR(S) : Fujikawa et al.

It is certified that error appears in the above-identified patent and that said Letters Patent is hereby corrected as shown below:

<u>Title page,</u>
Item [73], the Assignee's information should read:
-- [73] Assignee: Kabushiki Kaisha Kobe Seiko Sho (Kobe Steel, Ltd.), Kobe-shi (JP) --

Signed and Sealed this

Twenty-eighth Day of May, 2002

*Attest:*

*Attesting Officer*

JAMES E. ROGAN
*Director of the United States Patent and Trademark Office*